US006927999B2

United States Patent
Sim et al.

(10) Patent No.: US 6,927,999 B2
(45) Date of Patent: Aug. 9, 2005

(54) INTEGRATED CIRCUIT MEMORY DEVICES AND METHODS OF PROGRAMMING THE SAME IN WHICH THE CURRENT DRAWN DURING A PROGRAMMING OPERATION IS INDEPENDENT OF THE DATA TO BE PROGRAMMED

(75) Inventors: Soung-Hoon Sim, Incheon (KR); Hyo-Sang Lee, Gyeonggi-do (KR); Gyu-Hong Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 76 days.

(21) Appl. No.: 10/719,265

(22) Filed: Nov. 21, 2003

(65) Prior Publication Data
US 2004/0130945 A1 Jul. 8, 2004
US 2004/0208056 A9 Jul. 8, 2004

(30) Foreign Application Priority Data
Jan. 6, 2003 (KR) ................................ 10-2003-0000659

(51) Int. Cl.$^7$ ............................................. G11C 16/06
(52) U.S. Cl. ............................. 365/185.2; 365/185.18; 365/185.33
(58) Field of Search .......................... 365/185.2, 185.18, 365/185.33, 185.23

(56) References Cited

U.S. PATENT DOCUMENTS 6,785,163 B2 * 8/2004 Yeh et al. ................ 365/185.2

* cited by examiner

Primary Examiner—David Lam
(74) Attorney, Agent, or Firm—Myers Bigel Sibley & Sajovec

(57) ABSTRACT

An integrated circuit memory device includes a source line and a memory cell array that includes n memory cells that are connected to the source line. The n memory cells are operative to draw current from the source line in response to an n bit data word. A dummy memory cell circuit is operative to draw current from the source line responsive to the n bit data word such that a total current drawn by the memory cell array and the dummy memory cell circuit during a program operation is given by n*a current drawn by one of the n memory cells.

30 Claims, 8 Drawing Sheets

INTEGRATED CIRCUIT MEMORY DEVICES AND METHODS OF PROGRAMMING THE SAME IN WHICH THE CURRENT DRAWN DURING A PROGRAMMING OPERATION IS INDEPENDENT OF THE DATA TO BE PROGRAMMED

RELATED APPLICATION

This application claims priority to and the benefit of Korean Patent Application No. 2003-659, filed Jan. 6, 2003, the disclosure of which is hereby incorporated herein by reference.

FIELD OF THE INVENTION

The present invention relates to integrated circuit memory devices, and, more particularly, to integrated circuit flash memory devices.

BACKGROUND OF THE INVENTION

Flash memory devices may typically be categorized as NOR-type or NAND-type based on the way that memory cells are connected. NOR-type flash memory devices may be further categorized as stacked-gate NOR-type or split-gate NOR-type based on the structure of the memory cell. A conventional split-gate NOR-type flash memory device is typically configured such that sources of a plurality of split-gate memory cells are commonly connected to one source line. As a result, a voltage drop on the source line depends on the number of memory cells that are programmed during a program operation. This may result in variations in the program voltage to be used in programming the memory cells.

FIG. 1 is a block diagram that illustrates a conventional split-gate NOR-type flash memory device. The split-gate NOR-type flash memory device of FIG. 1 includes a memory cell array 10, a row decoder 12, a word line driver 14, a source decoder 16, a source line driver 18, a column decoder and multiplexer 20, and a data input circuit 22. In FIG. 1, i number of bit lines are represented by one bit line.

As shown in FIG. 1, the memory cell array 10 includes (2m×ni) split-gate memory cells, which are connected between ni bit lines BL11 to BL1i, . . . , BLn1 to BLni, 2m word lines WL to WL2m, and m source lines SL1 to SLm. The ni bit lines are configured in n groups with each group including i bit lines. In two memory cells vertically adjacent to each other, sources are commonly connected to the source line, drains are connected to the same bit line, and gates are connected to corresponding respective word lines.

Operation of the split-gate NOR-type flash memory device of FIG. 1 will now be described. An erase operation in the memory cell array 10 is performed in such a way that a relatively high voltage VPP is applied to the word lines WL1 to WL2m and a ground or reference voltage is applied to the bit lines BL11 to BL1i, . . . , BLn1 to BLni. In a program operation, a relatively high voltage VPP is applied to a selected source line of the source lines SL1 to SLm, a ground or reference voltage is applied to non-selected source lines, a predetermined voltage is applied to a selected word line of the word lines WL1 to WL2m, and a ground or reference voltage is applied to non-selected word lines. A corresponding memory cell is programmed when a predetermined voltage is applied to the bit lines BL11 to BL1i, . . . , BLn1 to BLni, and a corresponding memory cell is not programmed when a power supply voltage is applied to those bit lines.

In a read operation, a ground or reference voltage is applied to the source lines SL1 to SLm, a power supply voltage is applied to a selected word line of the word lines WL1 to WL2m, a ground or reference voltage is applied to non-selected word lines, a predetermined voltage is applied to a selected bit line of the bit lines BL11 to BL1i, . . . , BLn1 to BLni, and a ground or reference voltage is applied to non-selected bit lines, so that data is read from a corresponding memory cell. In a standby condition, a ground or reference voltage is applied to the source lines SL1 to SLm, the word lines WL1 to WL2m, and the bit lines BL11 to BL1i, . . . , BLn1 to BLni. The row decoder 12 decodes an x-bit row address RA1 to RAx to generate the word line selection signals W1 to W2m. The word line driver 14 applies a relatively high voltage to the word lines WL1 to WL2m in response to the word line selection signals W1 to W2m in an erase operation. The word line driver 14 applies a predetermined voltage to a selected word line and applies a ground or reference voltage to non-selected word lines in a program operation. The word line driver 14 applies a power supply voltage to a selected word line and applies a ground or reference voltage to non-selected word lines in a read operation. The word line driver 14 applies a ground or reference voltage to the word lines WL1 to WL2m in a standby condition. The source decoder 16 decodes the row address RA1 to RA(x−1) (excluding the lowest bit of the row address RA1 to RAx) to generate m source line selecting signals S1 to Sm. The source line driver 18 drives the source lines SL1 to SLm in response to the m source line selection signals S1 to Sm. The source line driver 18 applies a ground or reference voltage to the source lines SL1 to SLm in an erase operation, applies a relatively high voltage to a selected source line of the source lines SL1 to SLm, applies a ground or reference voltage to non-selected source lines in a program operation, and applies a ground or reference voltage to the source lines SL1 to SLm in a read operation and a standby condition.

The column decoder and multiplexer 20 decodes a y-bit column address CA1 to CAy to generate i column selection signals and transmits data from n data input/output lines IO1 to IOn to n bit lines in response to the i column selection signals. That is, the column decoder and multiplexer 20 selects one bit line from among i bit lines for each of n groups of bit lines B11 to BL1i, . . . , BLn1 to BLni to transmit data from the n data input/output lines IO1 to IOn to the n bit lines. The column decoder and multiplexer 20 applies a ground or reference voltage to the bit lines B11 to BL1i, . . . , BLn1 to BLni in an erase operation, applies a predetermined voltage and/or a power supply voltage to selected bit lines from among the i bit lines for each of the n groups of bit lines BL11 to BL1i, . . . , BLn1 to BLni in a program operation, applies a predetermined voltage and/or a ground/reference voltage to selected bit lines from among the i bit lines for each of the n groups of bit lines BL11 to BL1i, . . . , BLn1 to BLni in a read operation, and applies a ground or reference voltage to the n groups of bit lines BL11 to BL1i, . . . , BLn1 to BLni in a standby condition. In a program operation, the data input circuit 22 transmits a power supply voltage level to corresponding data input/output lines when input data has a "high" logic level and transmits a predetermined voltage, which is responsive to a bias voltage VBIAS, to corresponding data input/output lines when input data has a "low" logic level.

Erase operations and program operations of the flash memory device of FIG. 1 will now be described. When an erase command is applied, the word line driver 14 applies a high voltage VPP to the word lines WL1 to WL2m, the source line driver 18 applies ground or reference voltage signals to the source lines SL1 to SLm, and the column decoder and multiplexer 20 applies a ground or reference voltage signal to the n groups of bit lines BL11 to BL1I, ..., BLn1 to BLni. As a result, an erase operation for the memory cells in the memory cell array 10 is performed.

To illustrate a program operation, assume that a program command is applied, data DIN1 is at a "low" logic level, data DIN2 to DINn are at a "high" logic level, and the row address RA1 to RAx and the column address CA1 to CAy each have values of "00 . . . 0."

The row decoder 12 decodes the row address RA1 to RAx to enable the word line selection signal W1. The source decoder 16 decodes the row address RA1 to RA(x−1) to enable the source line selection signal S1. The data input circuit 22 drives the input data DIN1 to a "low" logic level and the input data DIN2 to DINn to a "high" logic level to transmit a predetermined voltage or a power supply voltage to the data input/output lines IO1 to IOn. The word line driver 14 applies a predetermined voltage (typically about 1 volt) to the word line W1 in response to the word line selection signal W1 and applies a ground or reference voltage to the rest of the word lines WL2 to WL2m. The source line driver 18 applies a relatively high voltage VPP to the source line SL1 and applies a ground or reference voltage to the rest of the source lines SL2 to SLm. The column decoder and multiplexer 20 decodes the column address CA1 to CAy to select the first n bit lines BL11 to BLn1 of the n groups of bit lines BL11 to BL1I, . . . , BLn1 to BLni, applies a predetermined voltage (typically about 0.4 to 0.5 volts) to the bit line BL11 in response to a signal on the data input/output lines IO1 to IOn, and applies a power supply voltage level signal to the bit lines BL2I to BLn1. In this manner, the memory cells connected between the n bit lines BL11 to BLn1 and the word line WL1 are programmed. That is, the memory cell connected between the bit line BL11 and the word line WL1 is programmed because electric current flows from the source line SL1 to the bit line BL11, and the rest of the memory cells connected between the bit line BL11 and the word line WL1 are not programmed because electric current does not flow from the source line SL1 to the bit lines BL21 to BLn1.

The memory cells in the memory cell array may be programmed using the above-described method. Because one memory cell is programmed, a voltage drop that occurs on the source line SL1 may not be large. When input data DIN1 to DINn are applied at a "low" logic level, however, because all of the n memory cells connected to the source line SL1 are programmed, an electric current flows from the source line SL1 to the bit lines BL11, BL21, . . . , BLn1, which may result in a relatively large voltage drop on the source, line.

In other words, a conventional flash memory device may experience a larger voltage drop on the source line as the number of memory cells to be programmed increases. This may result in variations in the voltage used to program memory cells as the voltage drop on the source line varies.

SUMMARY OF THE INVENTION

In accordance with some embodiments of the present invention, an integrated circuit memory device comprises a source line and a memory cell array that comprises n memory cells that are connected to the source line. The n memory cells are operative to draw current from the source line in response to an n bit data word. A dummy memory cell circuit is operative to draw current from the source line responsive to the n bit data word such that a total current drawn by the memory cell array and the dummy memory cell circuit during a program operation is given by n*a current drawn by one of the n memory cells.

In other embodiments of the present invention, each of the n memory cells is a split-gate flash memory cell.

In still other embodiments of the present invention, the n memory cells are commonly connected to the source line by respective source terminals.

In further embodiments of the present invention, the integrated circuit memory device further comprises a data input circuit that generates n output voltages in response to the n bit data word. The n memory cells receive the n output voltages via n drain terminals, respectively.

In still further embodiments of the present invention, the dummy memory cell circuit comprises a current adding circuit that generates an output voltage on a dummy bit line in response to the n bit data word and a dummy memory cell that is operative to draw current from the source line responsive to the output voltage on the dummy bit line.

In other embodiments of the present invention, an integrated circuit memory device comprises a source line, a data input circuit that is operative to output an n bit data word, and a dummy data input circuit that is operative to output a complement of the n bit data word. The device further comprises a memory cell array that comprises n memory cells that are connected to the source line. The n memory cells are operative to draw current from the source line responsive to the n bit data word. The device further comprises a dummy memory cell array that comprises n dummy memory cells that are connected to the source line. The n dummy memory cells are operative to draw current from the source line responsive to the complement of the n bit data word such that a total number of memory cells and dummy memory cells drawing current from the source line is n.

In still other embodiments of the present invention, an integrated circuit memory device may be programmed by applying n programming voltages to a memory cell array that comprises n memory cells so as to cause the memory cell array to draw current from a source line and applying at least one programming voltage to a dummy memory cell circuit so as to cause the dummy memory cell circuit to draw current from the source line such that a total current drawn by the memory cell array and the dummy memory cell array during a program operation is given by n*a current drawn by one of the n memory cells.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
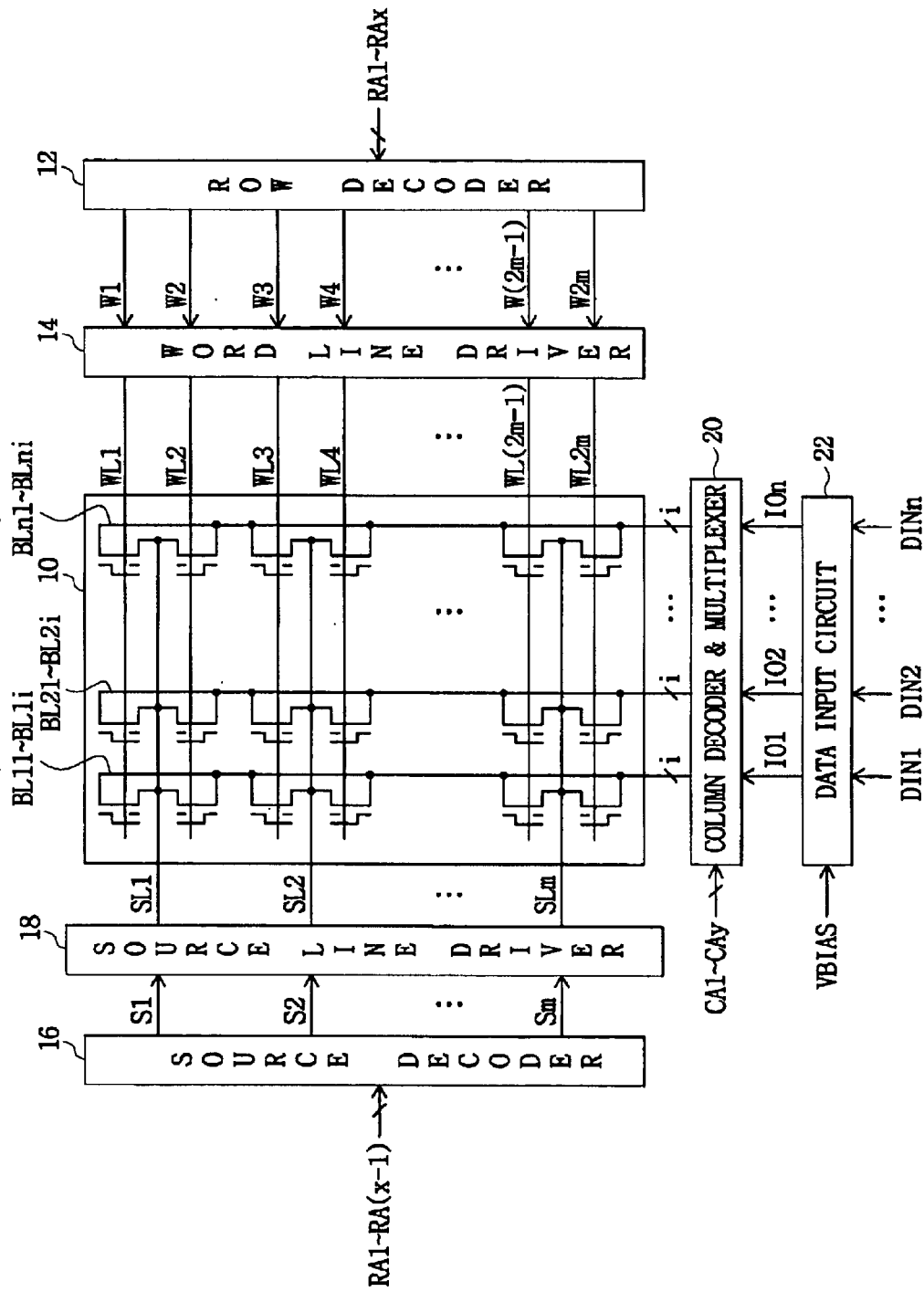
FIG. 1 is a block diagram that illustrates a conventional split-gate NOR-type flash memory device.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

Figure 2:
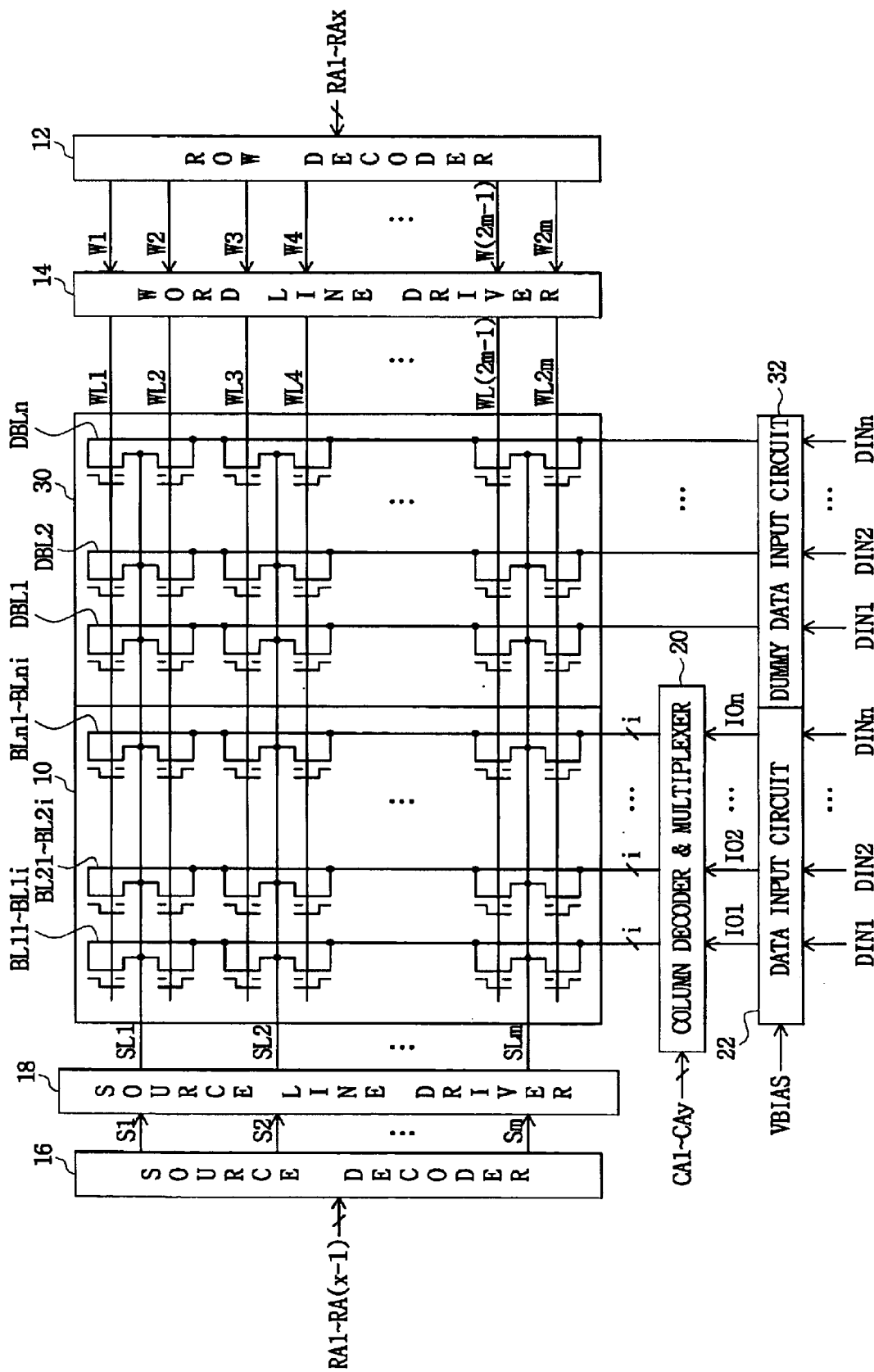
FIG. 2 is a block diagram that illustrates a split-gate NOR-type flash memory device in accordance with some embodiments of the present invention.

FIG. 2 is a block diagram that illustrates a split-gate NOR-type flash memory device in accordance with some embodiments of the present invention. The flash memory device of FIG. 2 comprises a dummy memory cell array 30 and a dummy data input circuit 32 in addition to the configuration of FIG. 1. As shown in FIG. 2, the dummy memory cell array 30 comprises (2m×n) split-gate dummy memory cells between n dummy bit lines DBL1 to DBLn, 2m word lines WL1 to WL2m, and m source lines SL1 to SLm. In two memory cells vertically adjacent to each other, sources are commonly connected to the source line, drains are connected to the same bit line, and gates are connected to corresponding respective word lines. Operations of the flash memory device of FIG. 2, in accordance with some embodiments of the present invention, will now be described.

In the interest of brevity, operations of components of FIG. 2 that are in common with components of FIG. 1 will be omitted as these operations have been described above. In the dummy memory cell array 30, in an erase operation, a program operation, and a standby condition, a voltage having the same level as applied to the memory cell array 10 is applied to the source lines SL1 to SLm and the word lines WL1 to WL2m. In an erase operation, a read operation, and a standby condition, a ground or reference voltage is applied to the dummy bit lines DBL1 to DBLn. In a program operation, a predetermined voltage is applied to the dummy bit lines DBL1 to DBLn to program a corresponding memory cell. The corresponding memory cell is not programmed when a power supply voltage is applied. The dummy data input circuit 32 applies a ground or reference voltage to the dummy bit lines DBL1 to DBLn in an erase operation, a read operation, and in a standby condition. In a program operation, the dummy data input circuit 32 inverts the input data DIN1 to DINn, and then applies a power supply voltage to a corresponding dummy bit line to prevent an electric current from flowing from a corresponding source line to a corresponding dummy bit line when the input data has a "low" logic level, and applies a predetermined voltage to a corresponding dummy bit line, which is responsive to a bias voltage VBIAS to allow a bias current to flow from a corresponding source line to a corresponding dummy bit line when the input data has a "high" logic level. As a result, a voltage applied to the dummy bit lines DBL1 to DBLn and a voltage applied to the n group of bit lines BL11 to BL1i, . . . , BLn1 to BLni are at complementary levels to each other. That is, when a voltage applied to one selected bit line of the bit lines BL11 to BL1i is at a predetermined level, a voltage applied to the dummy bit line DBL1 is at a power supply level.

Exemplary erase operations and program operations of the flash memory device of FIG. 2, in accordance with some embodiments of the present invention, will now be described. When an erase command is applied, the word line driver 14 applies a relatively high voltage VPP to the word lines WL1 to WL2m, the source line driver 18 applies a ground or reference voltage to the source lines SL1 to SLm, and the column decoder and multiplexer 20 and the dummy data input circuit 32 apply a ground or reference voltage to the n groups of the bit lines B11 to BL1i, . . . , BLn1 to BLni and the dummy bit lines DBL1 to DBLn. Consequently, an erase operation for the memory cells in the memory cell array 10 and the dummy memory cells in the dummy memory cell array 30 is performed.

For purposes of illustrating a program operation, assume that a program command is applied, data DIN1 is at a "low" logic level, data DIN2 to DINn are at a "high" logic level, and the row address RA1 to RAx and the column address CA1 to CAy each have a value of "00 . . . 0." The row decoder 12 decodes the row address RA1 to RAx to enable the word line selecting signal W1. The source decoder 16 decodes the row address RA1 to RA(x−1) to enable the source line selection signal S1. The data input circuit 22 drives the input data DIN1 to a "low" logic level and the input data DIN2 to DINn to a "high" logic level to transmit a predetermined voltage or a power supply voltage to the data input/output lines IO1 to IOn. The word line driver 14 applies a predetermined voltage (e.g., about 1 volt) to the word line W1 in response to the word line selection signal W1 and applies a ground or reference voltage to the rest of the word lines WL2 to WL2m. The source line driver 18 applies a relatively high voltage VPP to the source line SL1 and applies a ground or reference voltage to the rest of the source lines SL2 to SLm. The column decoder and multiplexer 20 decodes the column address CA1 to CAy to select n bit lines BL11 to BLn1 of the n groups of bit lines B11 to BL1I, . . . , BLn1 to BLni, applies a predetermined voltage (e.g., about 0.4 to 0.5 volts) to the bit line BL11 in response to a signal received from the data input/output lines IO1 to IOn, and applies a power supply voltage to the bit lines BL21 to BLn1. Consequently, the memory cell connected between the bit line BL11 and the word line WL1 is programmed because electric current flows from the source line SL1 to the bit line BL11, and the rest of the memory cells connected between the bit line BL11 and the word line WL1 are not programmed because electric current does not flow from the source line SL1 to the bit lines BL21 to BLn1. The dummy data input circuit 32 inverts input data DIN1 to DINn to transmit to the dummy bit lines DBL1 to DBLn. That is, the dummy data input circuit 32 applies a power supply voltage to the dummy bit line DBL1 and applies a predetermined voltage (e.g., about 0.4 to 0.5 volts) to the dummy bit lines DBL2 to DBLn. Therefore, the dummy memory cell connected between the dummy bit line DBL1 and the word line WL1 is not programmed because electric current does not flow from the source line SL1 to the dummy bit line DBL1, and the dummy memory cells connected between the dummy bit lines DBL2 to DBLn and the word line WL1 are programmed because a bias current flows from the source line SL1 to the dummy bit lines DBL2 to DBLn. An electric current that flows from one source line to one bit line is approximately equal to an electric current that flows from one source line to one dummy bit line. Because the split-gate NOR-type flash memory device typically has a characteristic that 70% to 80% of a source voltage is induced to a floating gate, even though a cell is programmed, a program current is not cut off and can continue to flow. Therefore, even though the dummy memory cell is programmed, when a predetermined voltage is applied to the dummy bit line, an electric current flows from a source of the dummy memory cell to a drain thereof.

The flash memory device of FIG. 2 operates such that the total sum of the number of the programmed memory cells in the memory cell array 10 and the number of the programmed dummy memory cells in the dummy memory cell array 30 is "n" when there are ni memory cells in the memory cell array 10 connected to one common source line and common word line and there are n dummy memory cells in the dummy memory cell array 30. That is, when one memory cell is programmed in the memory cell array 10, (n−1) number of the dummy memory cells are programmed in the dummy memory cell array 30. And, when (n−2) number of the memory cells are programmed in the memory cell array 10, two dummy memory cells are programmed in the dummy memory cell array 30. Therefore, because the number of memory cells to be programmed is identical regardless of the input data applied during a program operation, electric currents flowing from the source line to the bit line are approximately identical. As a result, voltage drops on the source line are approximately identical, and programming voltages for the memory cells are approximately identical.

Figure 3:
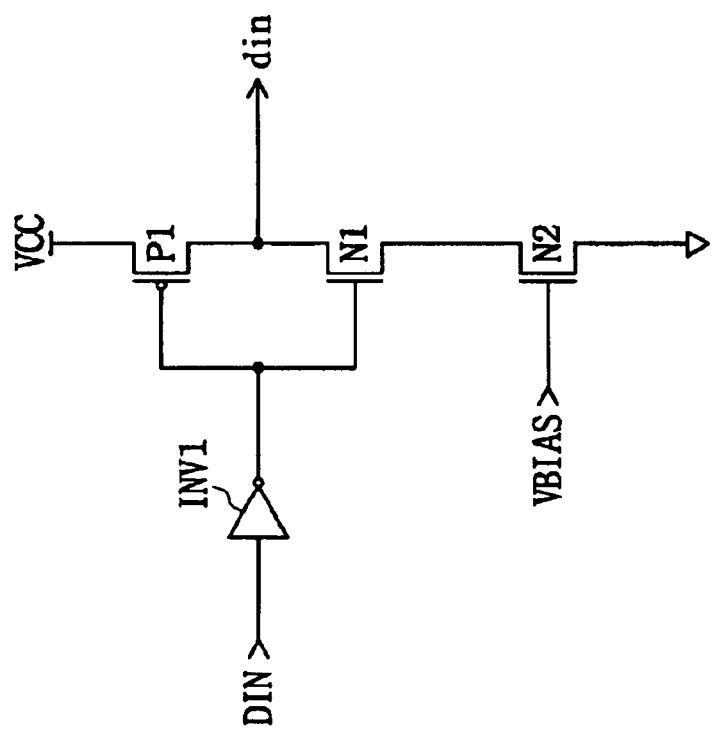
FIG. 3 is a circuit diagram that illustrates a data input circuit of the flash memory device of FIG. 2 in accordance with some embodiments of the present invention.

FIG. 3 is a circuit diagram that illustrates the data input circuit of the flash memory device of FIG. 2, in accordance with some embodiments of the present invention. The data input circuit comprises an inverter INV1, a PMOS transistor P1, and NMOS transistors N1 and N2, which are configured as shown. The data input circuit of FIG. 3 generates the output signal din in response to the input data DIN. In some embodiments, n data input circuits are provided. Exemplary operations of the data input circuit of FIG. 3, in accordance with some embodiments of the present invention, will now be described.

When a bias voltage VBIAS is applied during a program operation, the NMOS transistor N2 is turned on. When the input data DIN is at a "high" logic level, the inverter INV1 inverts the DIN signal to generate a "low" logic level signal. As a result, the PMOS transistor P1 is turned on to generate the signal din at a power supply voltage level.

When the input data DIN is at a "low" logic level, the inverter INV1 inverts the DIN signal to generate a "high" logic level signal. As a result, the NMOS transistor N1 is turned on to generate the din signal at a predetermined voltage level. Hence, a bias current flows from the source line to the bit line. That is, the data input circuit generates a signal din having a power supply voltage level when the input data DIN is at a "high" logic level and generates a signal din having a predetermined voltage level when the input data DIN is at a "low" logic level.

Figure 4:
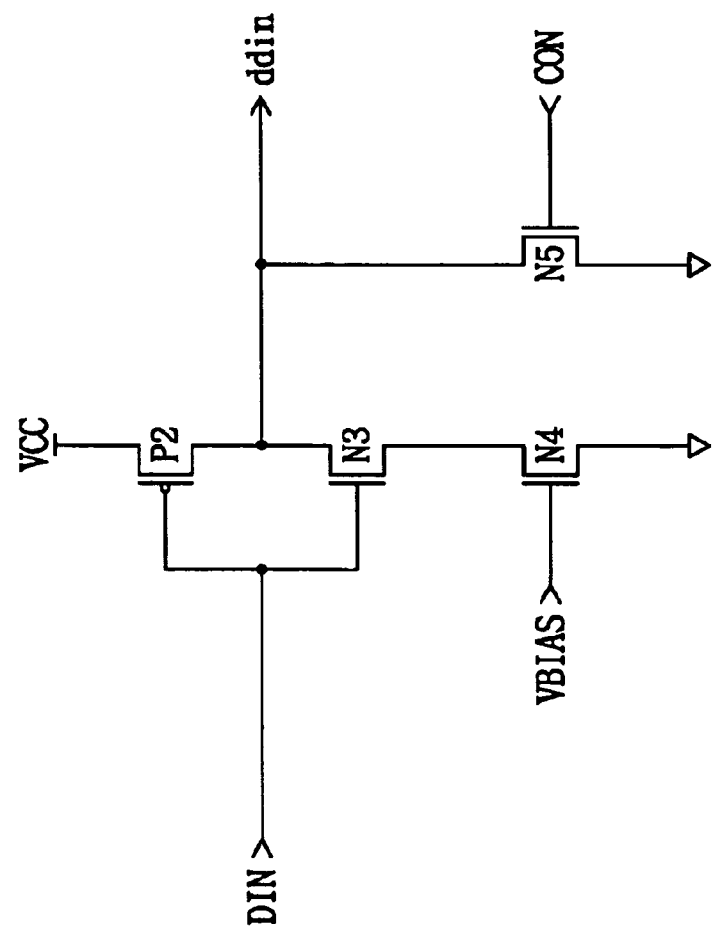
FIG. 4 is a circuit diagram that illustrates a dummy data input circuit of the flash memory device of FIG. 2 in accordance with some embodiments of the present invention.

FIG. 4 is a circuit diagram that illustrates the dummy data input circuit of the flash memory device of FIG. 2, in accordance with some embodiments of the present invention. The dummy data input circuit of FIG. 4 comprises a PMOS transistor P2 and NMOS transistors N3 to N5, which are configured as shown. The dummy data input circuit of FIG. 4 generates an output signal ddin in response to the input data DIN. In some embodiments, n dummy data input circuits are provided. Exemplary operations of the dummy data input circuit of FIG. 4, in accordance with some embodiments of the present invention, will now be described.

In an erase operation, a read operation, and a program operation, when a control signal CON having a "high" logic level is applied, the NMOS transistor N5 is turned on to generate the signal ddin at a ground or reference voltage level. When the input data DIN is at a "high" logic level, the NMOS transistor N3 is turned on to generate the signal ddin at a predetermined voltage level. Hence, a bias current flows from the source line to the dummy bit line. This bias current is approximately the same as the bias current that flows from the source line to the bit line. When the input data DIN is at a "low" logic level, the PMOS transistor P2 is turned on to generate the signal ddin at a power supply voltage level.

As described above, the data input circuit and the dummy data input circuit generate signals having different logic states in response to the input data DIN. The flash memory device, according to some embodiments of the present invention, additionally includes a dummy memory cell array having dummy memory cells disposed between the same number of word and source lines as that of the memory cell array and also having a same number of dummy bit lines as the number of data input/output lines. Accordingly, the sum of the number of the memory cells programmed in the memory cell array and the number of the dummy memory cells programmed in the dummy memory cell array, i.e., the number of the programmed memory cells connected to one source line, is equal to the number of data input/output lines regardless of the input data. Therefore, electric currents flowing from the source line to the bit line and the dummy bit line are approximately the same. This results in approximately the same voltage drop on the source line regardless of the input data so that variations in the voltage used to program the memory cells may be reduced.

Figure 5:
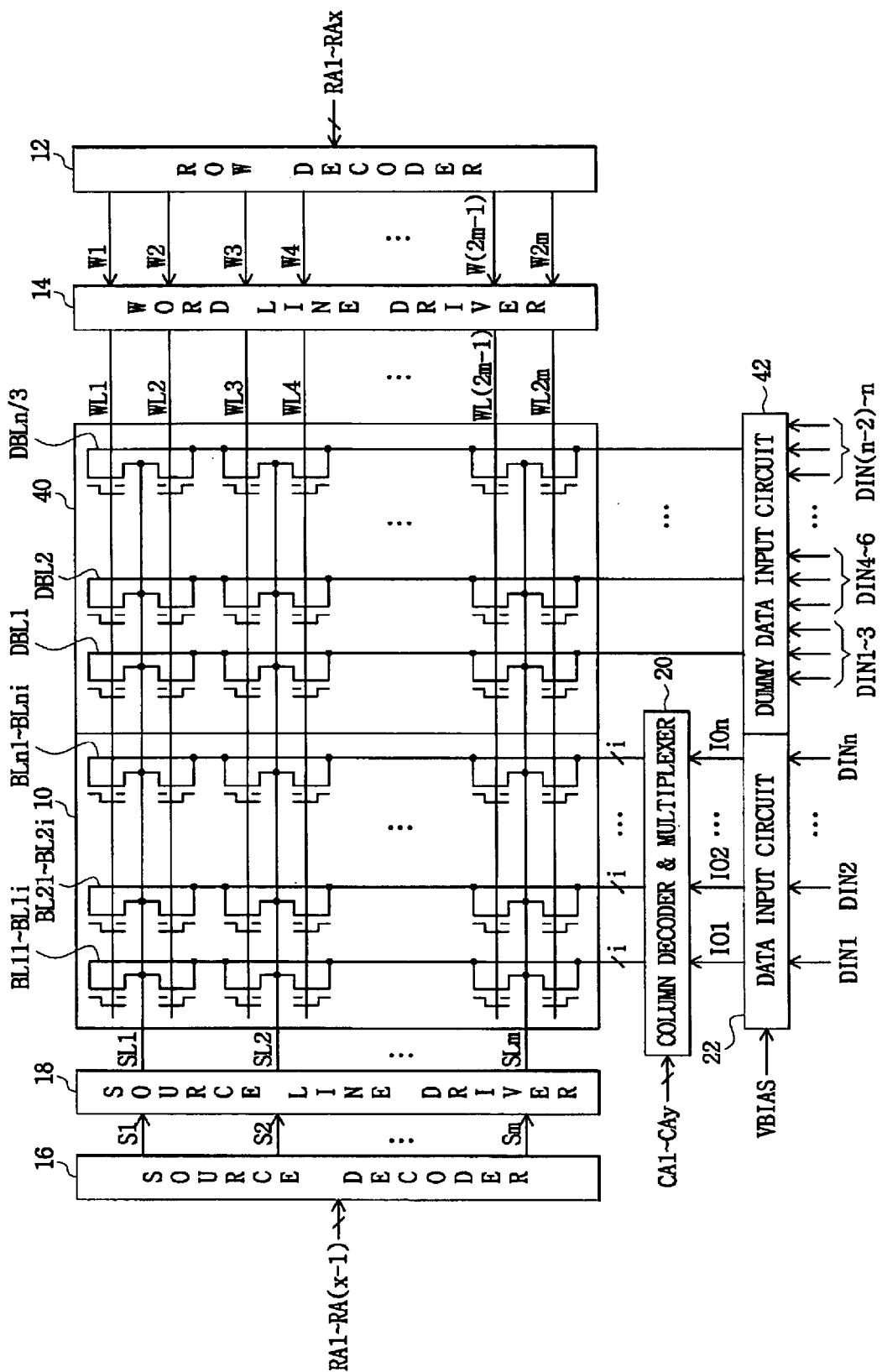
FIG. 5 is a block diagram that illustrates a split-gate NOR-type flash memory device according to additional embodiments of the present invention.

FIG. 5 is a block diagram that illustrates a split-gate NOR-type flash memory device according to additional embodiments of the present invention. The flash memory device of FIG. 5 comprises a dummy memory cell array 40 and a dummy data input circuit 42 in addition to the configuration of the flash memory device of FIG. 1. As shown in FIG. 5, the dummy memory cell array 40 comprises 2m×n/3 split-gate dummy memory cells between n/3 dummy bit lines DBL1 to DBLn/3, 2m word lines WL1 to WL2m, and m source lines SL1 to SLm. In two memory cells vertically adjacent to each other, sources are commonly connected to the source line, drains are connected to the same bit line, and gates are connected to corresponding respective word lines. Operations of the flash memory device of FIG. 5, in accordance with some embodiments of the present invention, will now be described.

In the interest of brevity, operations of components of FIG. 5 that are in common with components of FIG. 1 will be omitted as these operations have been described above. The dummy memory cell array 40 performs similar operations as the dummy memory cell array 30 of FIG. 2. The dummy data input circuit 42 applies a ground or reference voltage to the dummy bit lines DBL1 to DBLn/3 in an erase operation, a read operation, and a standby condition. In a program operation, the dummy data input circuit 42 inverts the input data DIN1 to DINn three by three, and then drives a corresponding dummy bit line to a power supply voltage level when all of the three input data have a "low" logic level, and drives a corresponding dummy bit line to a predetermined voltage when at least one of the three input data has a "high" logic level. The electric current flowing to a corresponding dummy bit line depends on the number of three input data signals having a "high" logic level.

Figure 6:
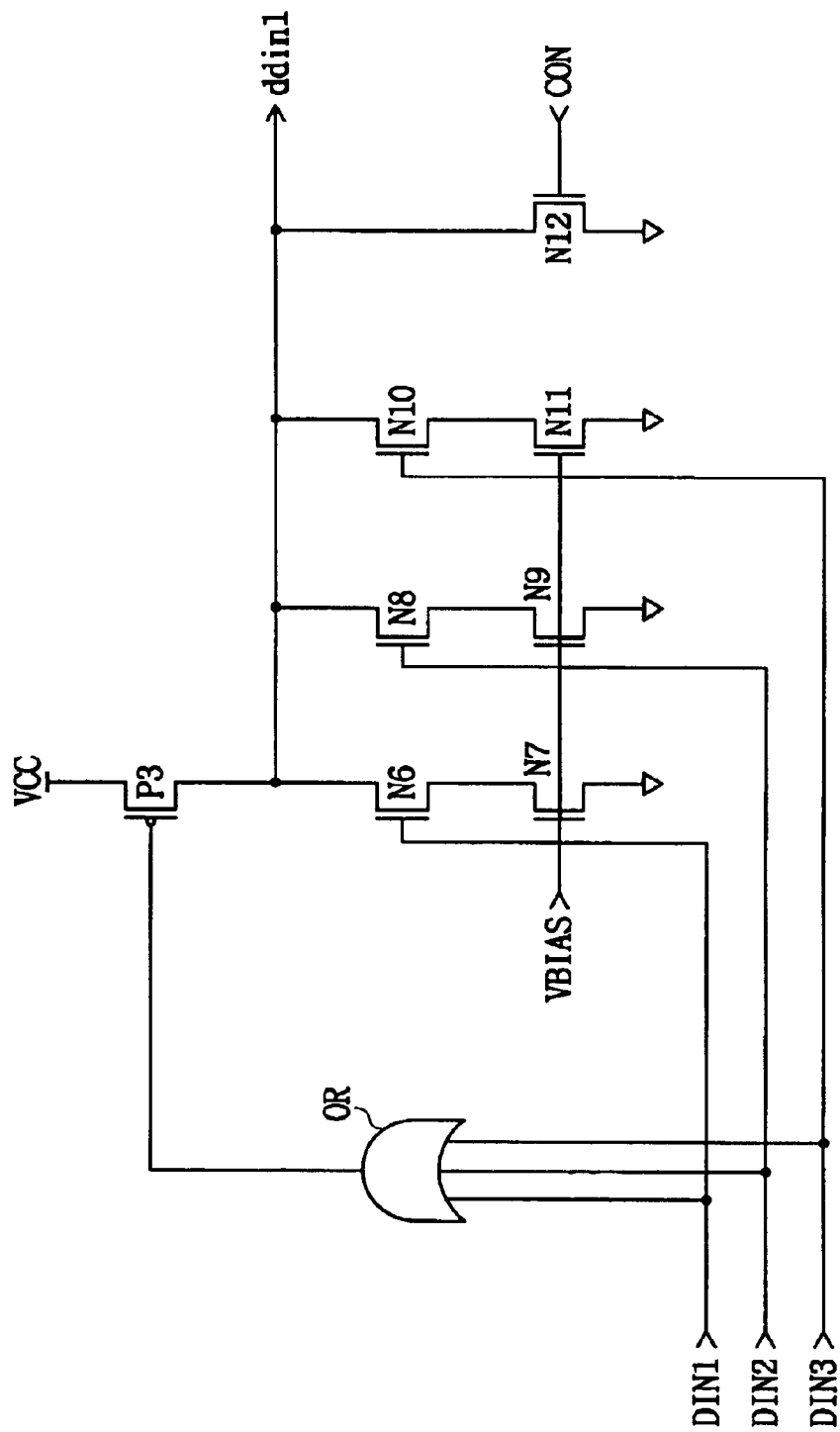
FIG. 6 is a circuit diagram that illustrates a dummy data input circuit of the flash memory device of FIG. 5 in accordance with some embodiments of the present invention.

FIG. 6 is a circuit diagram that illustrates the dummy data input circuit of the flash memory device of FIG. 5, in accordance with some embodiments of the present invention. The dummy data input circuit of FIG. 6 comprises an OR gate OR, a PMOS transistor P3, and NMOS transistors N6 to N12, which are configured as shown. The dummy data input circuit of FIG. 6 generates the output signal ddin1 in response to three input data signals DIN1 to DIN3, . . . , DIN(n–2) to DINn. In some embodiments, n/3 dummy data input circuits are provided. Exemplary operations of the dummy data input circuit of FIG. 6, in accordance with some embodiments of the present invention, will now be described.

In an erase operation, a read operation and a standby condition, when a control signal CON having a "high" logic level is applied, the NMOS transistor N12 is turned on to generate the ddin1 signal at a ground or reference voltage level. In a program operation, when a bias voltage VBIAS is applied, the NMOS transistors N7, N9 and N11 are turned on. When all of the input data DIN1 to DIN3 are at a "low" logic level, the OR gate OR generates a "low" logic level output signal. Hence, the PMOS transistor P3 is turned on to drive the ddin1 signal to a power supply voltage level.

When the input data DIN1 to DIN3 are at a "high" logic level, a "low" logic level, and a "low" logic level, respectively, the OR gate OR generates a "high" logic level output signal. Hence, the NMOS transistor N6 is turned on, and the PMOS transistor P3 is turned off, so that the ddin1 signal is driven to a predetermined voltage. As a result, a bias current flows from the source line to the dummy bit line. The bias current is approximately the same as the current flowing from the source line to one bit line.

When the input data DIN1 to DIN3 are at a "high" level, a "high" level, and a "low" level, respectively, the OR gate OR generates a "high" logic level output signal. Hence, the NMOS transistors N6 and N8 are turned on, and the PMOS transistor P3 is turned off, so that the ddin1 signal is driven to a predetermined voltage. As a result, a bias current flows from the source line to the dummy bit line. This bias current is approximately the same as the bias current flowing from the source line to two bit lines.

When all of the input data DIN1 to DIN3 are at a "high" logic level, the OR gate OR generates a "high" logic level output signal. Hence, the NMOS transistors N6, N8 and N10 are turned on, and the PMOS transistor P3 is turned off, so that the ddin1 signal is driven to a predetermined voltage. As a result, a bias current flows from the source line to the dummy bit line. This bias current is approximately the same as the bias current flowing from the source line to three bit lines. Thus, the dummy data input circuit of FIG. 6 can control the current amount flowing through one dummy bit line based on three input data signals.

As described above, the flash memory device of FIG. 5 can reduce the amount of layout area needed because there is no need to have the same number of dummy bit lines and data input/output lines, even as the number of the data input/output lines increases. The dummy data input circuit of FIG. 6 is configured to control a current flowing through one dummy bit line based on three input data signals. In other embodiments, the current amount flowing through one dummy bit line may be controlled based on two, four or more input data signals.

Figure 7:
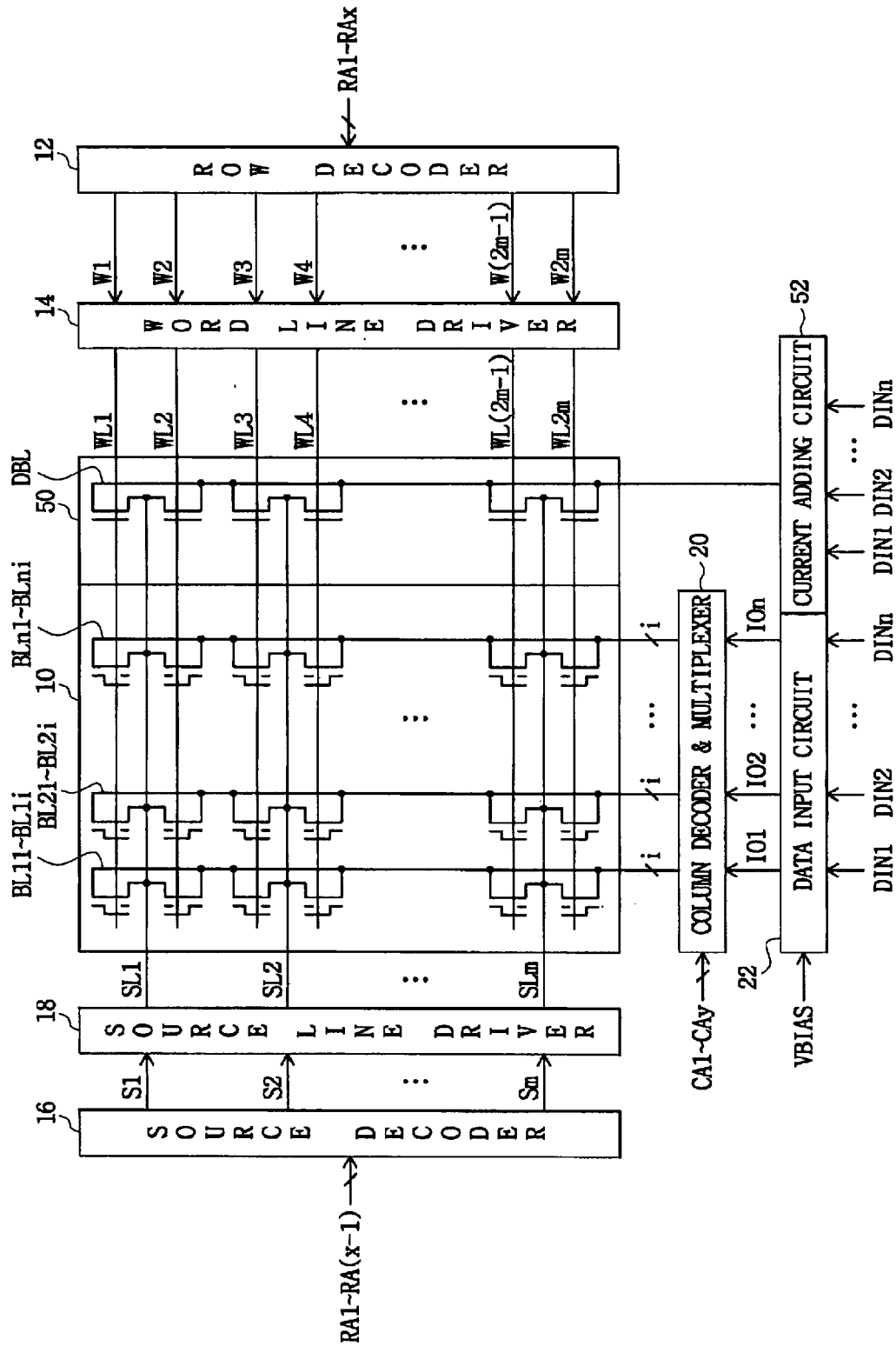
FIG. 7 is a block diagram that illustrates a split-gate NOR-type flash memory device according additional embodiments of the present invention.

FIG. 7 is a block diagram that illustrates a split-gate NOR-type flash memory device according additional embodiments of the present invention. The flash memory device of FIG. 7 comprises an NMOS transistor array 50 and a current adding circuit 52 in addition to the configuration of the flash memory device of FIG. 1. As shown in FIG. 7, the NMOS transistor array 50 includes 2m NMOS transistors connected between a dummy bit line DBL, 2m word lines WL1 to WL2m, and m source lines SL1 to SLm. In two NMOS transistors vertically adjacent to each other, sources are commonly connected to the source line, drains are connected to the dummy bit line, and gates are connected to corresponding respective word lines. The NMOS transistors in the NMOS transistor array are designed such that a gate oxide has a thickness sufficient to endure a relatively high voltage. Operations of the flash memory device of FIG. 7, in accordance with some embodiments of the present invention, will now be described.

In the interest of brevity, operations of components of FIG. 7 that are in common with components of FIG. 1 will be omitted as these operations have been described above. The NMOS transistor array 50 applies the same voltage level to the source lines SL1 to SLm and the word lines WL1 to WL2m as that applied to the memory cell array 10 in an erase operation, a program operation, and a standby condition. A ground or reference voltage is applied to the dummy bit line DBL in an erase operation, a read operation, and a standby condition, and a predetermined voltage or a power voltage is applied to the dummy bit line DBL in a program operation. The current adding circuit 52 controls a current flowing to the dummy bit line DBL in response to the input data DIN1 to DINn. That is, if it is assumed that nI is a current flowing when n memory cells connected to one source line in the memory cell array 10 are simultaneously programmed and I is a current flowing from one source line to the bit line when one memory cell in the memory cell array 10 is programmed, the current adding circuit 52 adjusts a current flowing from one source line to the bit line DBL1 to be (n–1)I in response to the input data DIN1 to DINn.

Figure 8:
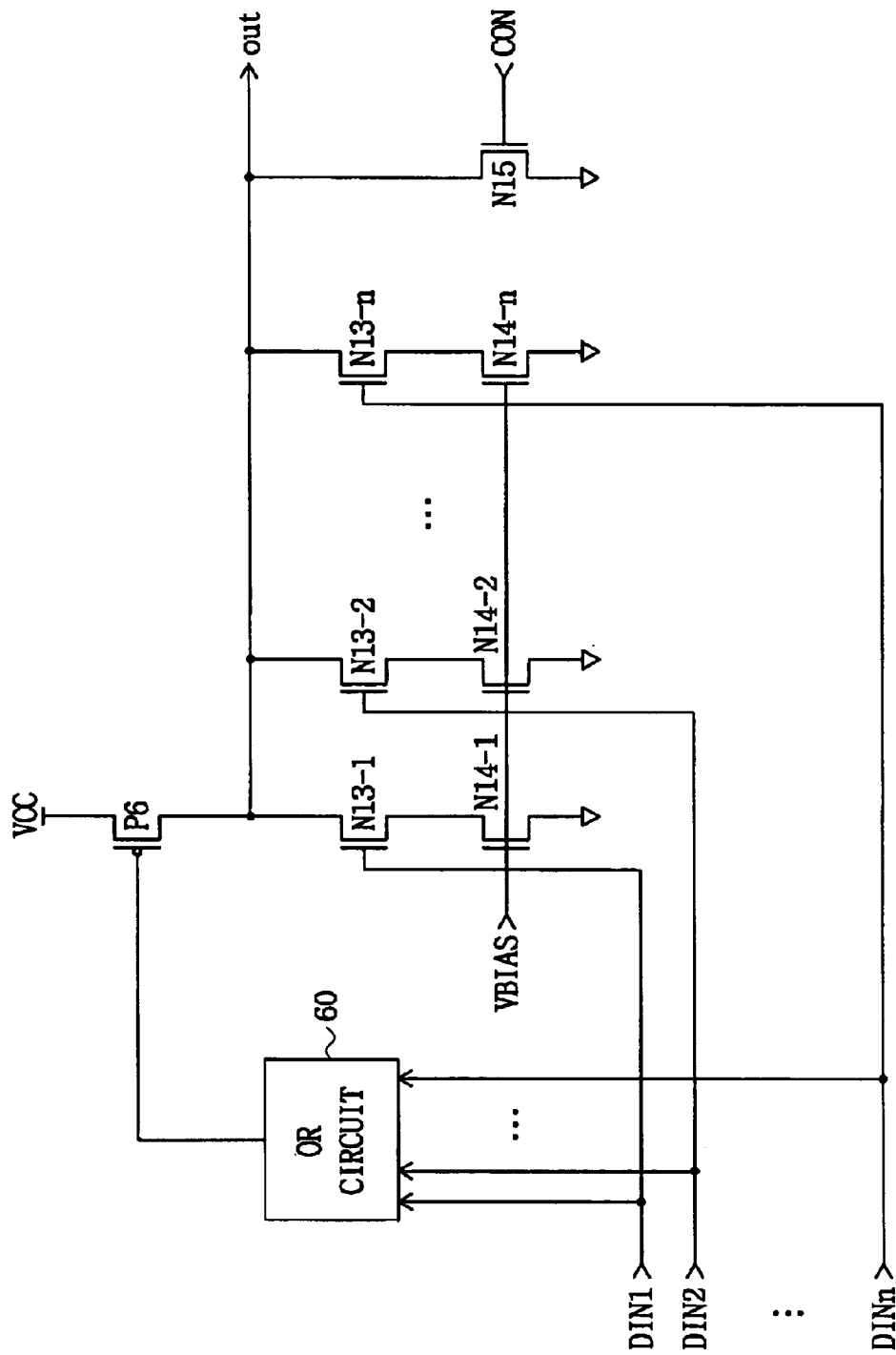
FIG. 8 is a circuit diagram that illustrates a current adding circuit of the flash memory device of FIG. 7 in accordance with some embodiments of the present invention.

FIG. 8 is a circuit diagram that illustrates the current adding circuit of the flash memory device of FIG. 7, in accordance with some embodiments of the present invention. The current adding circuit of FIG. 8 comprises a PMOS transistor P6, NMOS transistors N13-1 to N13-n, N14-1 to N14-n, and N15, and an OR circuit 60. Exemplary operations of the current adding circuit of FIG. 8, in accordance with some embodiments of the present invention, will now be described.

In an erase operation, a read operation, and a standby condition, when a control signal CON is driven to a "high" logic level, the NMOS transistor N15 is turned on to drive an output signal out to a ground or reference voltage level. In a program operation, when a bias voltage VBIAS is applied, the NMOS transistors N14-1 to N14-n are turned on. When all of the input data DIN1 to DINn are at a "low" logic level, the OR circuit 60 generates a "low" logic level output signal. The PMOS transistor P6 is turned on in response to the "low" logic level output signal from the OR circuit 60 and drives the output signal out to a power supply voltage level.

When the input data DIN1 is at a "high" logic level and the rest of the input data DIN2 to DINn are at a "low" logic level, the OR circuit 60 generates an output signal at a "high" logic level, so that the PMOS transistor P6 is turned off. The NMOS transistor N13-1 is turned on, and the NMOS transistors N13-2 to N13-n are turned off, so that the output signal out is driven to a predetermined voltage level. Hence, a bias current flows from the source line to the dummy bit line. If I is a bias current flowing from the source line to one bit line, a bias current flowing from the source line to the dummy bit line becomes I.

When the input data DIN1 to DIN(n−1) are at a "high" logic level and the input data DINn is at a "low" logic level, the OR circuit 60 generates an output signal at a "high" logic level, so that the PMOS transistor P6 is turned off. The NMOS transistors N13-1 to N13(n−1) are turned on, and the NMOS transistor N13-n is turned off, so that the output signal out is driven to a predetermined voltage. Hence, a bias current flows from the source line to the dummy bit line. If I is a bias current flowing from the source line to one bit line, then a bias current flowing from the source line to the dummy bit line becomes (n−1)I. If I is a bias current flowing from the source line to one bit line, when the input data DIN1 to DINn all are at a "high" logic level, a bias current flowing from the source line to the dummy bit line becomes nI.

The flash memory device of FIG. 7 adjusts the currents flowing from one source line to the bit line and the dummy bit line in a memory cell array during a program operation so that the currents are approximately identical regardless of the input data. This is accomplished by using the NMOS transistor array and the current adding circuit connected to one dummy bit line to ensure that voltage drops on the source line are approximately identical. Hence, variations in a voltage used to program memory cells may be reduced. Moreover, the flash memory device of FIG. 7 may consume less layout area than the flash memory device embodiments of FIGS. 2 and 5 by using the NMOS transistor array connected to one dummy bit line.

Although embodiments of the present invention have been described herein with reference to a split-gate NOR-type flash memory device configuration, it will be understood that the present invention may also be applied to memory cells that are not configured as split-gate flash memory cells. According to some embodiments of the present invention, a current flowing from a source line to a bit line may be controlled to ensure that it is approximately the same regardless of data input to a flash memory device. As a result, a voltage drop on the source line is about the same regardless of the input data. This ensures that the voltage used to program the memory cells is approximately the same regardless of the input data.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. An integrated circuit memory device, comprising:
   a source line;
   a data input circuit that is operative to output an n bit data word;
   a dummy data input circuit that is operative to output a complement of the n bit data word;
   a memory cell array that comprises n memory cells that are connected to the source line, the n memory cells being operative to draw current from the source line responsive to the n bit data word; and
   a dummy memory cell array that comprises n dummy memory cells that are connected to the source line, the n dummy memory cells being operative to draw current from the source line responsive to the complement of the n bit data word such that a total number of memory cells and dummy memory cells drawing current from the source line is n.

2. The integrated circuit memory device of claim 1, wherein each of the n memory cells and the n dummy memory cells is a split-gate flash memory cell.

3. The integrated circuit memory device of claim 1, wherein the n memory cells and the n dummy memory cells are commonly connected to the source line by respective source terminals.

4. The integrated circuit memory device of claim 1, wherein the n memory cells are connected to the n bit data word via n drain terminals, respectively, and wherein the n dummy memory cells are connected to the complement of the n bit data word via n dummy drain terminals, respectively.

5. An integrated circuit memory device, comprising:
   a source line;
   a memory cell array that comprises n memory cells that are connected to the source line, the n memory cells being operative to draw current from the source line responsive to an n bit data word; and
   a dummy memory cell circuit that is operative to draw current from the source line responsive to the n bit data word such that a total current drawn by the memory cell array and the dummy memory cell circuit during a program operation is given by n*a current drawn by one of the n memory cells.

6. The integrated circuit memory device of claim 5, wherein each of the n memory cells is a split-gate flash memory cell.

7. The integrated circuit memory device of claim 5, wherein the n memory cells are commonly connected to the source line by respective source terminals.

8. The integrated circuit memory device of claim 5, further comprising:
   a data input circuit that generates n output voltages in response to the n bit data word; and
   wherein the n memory cells receive the n output voltages via n drain terminals, respectively.

9. The integrated circuit memory device of claim 5, wherein the dummy memory cell circuit comprises:
   a current adding circuit that generates an output voltage on a dummy bit line in response to the n bit data word; and
   a dummy memory cell that is operative to draw current from the source line responsive to the output voltage on the dummy bit line.

10. An integrated circuit memory device, comprising:
   a source line;
   a memory cell array that comprises n memory cells that are connected to the source line, the n memory cells being operative to draw current from the source line responsive to an n bit data word; and
   a dummy memory cell circuit that comprises n/y dummy memory cells that are connected to the source line, the n/y dummy memory cells being operative to draw current from the source line responsive to the n bit data word such that respective currents drawn by respective ones of the n/y dummy memory cells ranges from approximately zero to y*a current drawn by one of the n memory cells.

11. The integrated circuit memory device of claim 10, wherein each of the n memory cells and the n/y dummy memory cells is a split-gate flash memory cell.

12. The integrated circuit memory device of claim 10, wherein the n memory cells are commonly connected to the source line by respective source terminals.

13. The integrated circuit memory device of claim 10, a data input circuit that generates n output voltages in response to the n bit data word; and
wherein the n memory cells receive the n bit data word via n drain terminals, respectively.

14. The integrated circuit memory device of claim 10, wherein the dummy memory cell circuit comprises:
an input circuit that generates an output voltage on at least one dummy bit line in response to the n bit data word; and
a dummy memory cell array that comprises at least one dummy memory cell that is operative to draw current from the source line responsive to the output voltage on the at least one dummy bit line.

15. A method of operating an integrated circuit memory device, comprising:
applying n programming voltages to a memory cell array that comprises n memory cells so as to cause the memory cell array to draw current from a source line; and
applying at least one programming voltage to a dummy memory cell circuit so as to cause the dummy memory cell circuit to draw current from the source line such that a total current drawn by the memory cell array and the dummy memory cell array during a program operation is given by n*a current drawn by one of the n memory cells.

16. The method of claim 15, further comprising:
generating the n programming voltages in response to an n bit data word; and
generating the at least one programming voltage in response to the n bit data word.

17. A flash memory device, comprising:
a memory cell array including ni×2m memory cells having a drain connected to each of ni bit lines in which each of n groups of memory cells comprises i bit lines, a gate connected to each of 2m word lines, and a source connected to each of m source lines; and
a dummy array including 2m transistors having a gate connected to each of the 2m word lines, a source connected to each of the m source lines, and a drain connected to at least one or more dummy bit line;
wherein in a program operation, a sum of a bias current flowing from the source line to the bit lines and a bias current flowing from the source line to the at least one or more dummy bit line in response n input data is identical to a bias current flowing from the source line to the n bit lines when the n memory cells in the memory cell array are programmed.

18. A flash memory device, comprising:
a memory cell array including ni×2m memory cells having a drain connected to each of ni bit lines in which each of n groups of memory cells comprises i bit lines, a gate connected to each of 2m word lines, and a source connected to each of m source lines;
a program circuit that is operable to generate a bias current flow from a selected source line to selected bit lines of the memory cell array in response to n input data in a program operation;
a dummy array including 2m transistors having a gate connected to each of the 2m word lines, a source connected to each of the m source lines, and a drain connected to at least one dummy bit lines; and
a dummy program circuit that is operable to generate a bias current flow from a selected source line of the dummy array to the at least one or more dummy bit lines in response to the n input data in a program operation.

19. The device of claim 18, wherein in a program operation, a sum of a bias current flowing from the selected source line to the selected bit lines and a bias current flowing from the selected source line to the at least one or more dummy bit lines is identical to a bias current flowing from the selected source line to the n bit lines when n memory cells in the memory cell array are programmed.

20. The device of claim 18, wherein each of the ni×2m memory cells is a split-gate flash memory cell.

21. The device of claim 18, wherein the dummy array comprises n×2m dummy memory cells having a drain connected to each of the n dummy bit lines, a gate connected to each of the 2m word lines and a source connected to each of the m source lines.

22. The device of claim 21, wherein each of the n×2m dummy memory cells is a split-gate flash memory cell.

23. The device of claim 21, wherein the dummy program circuit comprises n data input circuits inputting data to each of the n dummy bit lines in response to the n input data;
each of the n data input circuits comprising:
a first pull-up transistor having a source to which a power voltage is applied, a gate to which the input data is applied, and a drain connected to the dummy bit line;
a first pull-down transistor having a drain connected to the dummy bit line and a gate to which the input data is applied;
a bias current generating transistor having a drain connected to a source of the first pull-down transistor and a source to which a ground voltage is applied and generating the bias current flow in response to a bias voltage generated in a program operation; and
a reset transistor resetting the dummy bit line to a ground voltage level in response to a control signal generated in an erase operation, a read operation, and a standby condition.

24. The device of claim 18, wherein the dummy array comprises n/y×2m dummy memory cells having a drain connected to each of n/y dummy bit lines, a gate connected to each of the 2m word line, and a source connected to each of the m source lines.

25. The device of claim 24, wherein each of the n/y×2m dummy memory cells is a split-gate flash memory cell.

26. The device of claim 24, wherein the dummy program circuit comprises n/y groups of data input circuits providing data to each of the n/y dummy bit lines in response to a predetermined number of input data of the n input data,
each of the n/y groups of the data input circuits comprises:
an OR gate that is operable to perform a logical OR of the predetermined number of the input data;
a first pull-up transistor having a source to which a power voltage is applied, a gate to which an output signal of the OR gate is applied, and a drain connected to the dummy bit line;
a predetermined number of first pull-down transistors having a drain connected to the dummy bit line and a gate to which the predetermined number of the input data is respectively applied;

a predetermined number of bias current generating transistors having a drain connected to a source of each of the predetermined number of the first pull-down transistors and a source to which a ground voltage is applied and generating the bias current flow in response to a bias voltage generated in a program operation; and a reset transistor resetting the dummy bit line to a ground voltage level in response to a control signal generated in an erase operation, a read operation and a standby condition.

27. The device of claim 18, wherein the dummy array comprises 2m transistors having a drain connected to one of the at least one dummy bit line, a gate connected to each of the 2m word lines, and a source connected to each of the m source lines.

28. The device of claim 27, wherein each of the 2m transistors is an NMOS transistor, and a gate oxide of each of the NMOS transistors is relatively thick.

29. The device of claim 27, wherein the dummy program circuit comprises a pull-up transistor having a source connected to the one of the at least one dummy bit line and a gate to which a combination signal of the n input data is applied;

n pull-down transistors having a drain connected to a drain of the pull-up transistor and a gate to which the n input data are respectively applied;

n bias current generating transistors having a drain connected to a source of each of the n pull-down transistors, a gate to which a bias voltage is applied in a program operation, and a source to which a ground voltage is applied; and a reset transistor operable to reset the dummy bit line to a ground voltage level in response to a control signal in an erase operation, a read operation, and a standby condition.

30. A method of programming a flash memory device, the flash memory device having a memory cell array including ni×2m memory cells having a drain connected to each of ni bit lines in which each of the n groups of memory cells comprises i bit lines, a gate connected to each of 2m word lines, and a source connected to each of m source lines, the method comprising:

providing at least 2m transistors having a gate connected to each of the 2m word lines, a source connected to each of the m source lines, and a drain connected to at least one or more dummy bit lines;

generating a bias current from a selected source line of the memory cell array to (n−x) selected bit lines in response to n input data in a program operation, where x is an integer from 0 to n;

generating, in a program operation, a bias current flowing from the selected source line to the at least one or more dummy bit line in response to the n input data that is identical to a bias current flowing from the selected source line to the x bit lines when the x memory cells in the memory cell array are programmed.

* * * * *